United States Patent [19]

Smythe, Jr. et al.

[11] Patent Number: 5,194,837
[45] Date of Patent: Mar. 16, 1993

[54] MULTI-TAP PROGRAMMING CIRCUIT FOR TRANSVERSAL FILTERS

[75] Inventors: Daniel L. Smythe, Jr., Carlisle; Jonathan B. Green, Belmont, both of Mass.

[73] Assignee: Massachusetts Institute of Technology, Cambridge, Mass.

[21] Appl. No.: 795,301

[22] Filed: Nov. 20, 1991

Related U.S. Application Data

[63] Continuation of Ser. No. 324,307, Mar. 16, 1989, abandoned.

[51] Int. Cl.$^5$ ............................................. H03H 15/00
[52] U.S. Cl. .................................... 333/166; 333/152; 310/313 R
[58] Field of Search ................................. 333/150–159, 333/193–196, 166, 139, 165; 310/313 R, 313 B, 313 C, 313 D; 364/821; 357/24, 24 M

[56] References Cited

U.S. PATENT DOCUMENTS

| | | | |
|---|---|---|---|
| 3,568,107 | 3/1971 | Haggarty | 333/166 |
| 3,631,232 | 12/1971 | Perreault et al. | 333/166 X |
| 3,982,113 | 9/1976 | Coldren | 333/150 X |
| 3,997,973 | 12/1976 | Buss | 333/166 |
| 4,120,035 | 10/1978 | Cases et al. | 333/166 X |
| 4,163,958 | 8/1979 | Gerard | 333/193 X |
| 4,227,160 | 10/1980 | Tamori et al. | 333/166 |
| 4,298,953 | 11/1981 | Monroe | 364/825 |
| 4,468,639 | 8/1984 | Green et al. | 333/153 |
| 4,600,852 | 7/1986 | Garber | 310/313 B |
| 4,611,140 | 9/1986 | Whitlock et al. | 333/154 X |
| 4,752,750 | 6/1988 | Zimmerman et al. | 333/166 |

FOREIGN PATENT DOCUMENTS

115918 7/1983 Japan .................................. 333/166

OTHER PUBLICATIONS

Panasik, et al, "A 32 Tap Digitally Controlled Programmable Transversal Filter," 1988 Ultrasonics Symposium.
M. J. Hoskins, et al, "Acoustic Charge Transport (ACT) Multitap Delay Line," ADB086 697, Apr., 1984.
Panasik, et al, "A 16 Tap Hybrid Programmable Transversal Filter Using Monolithic GaAs Dual-Gate Fet Array," 1985 Ultrasonics Symposium, pp. 130–133.
Oates, et al, "SAW/FET Programmable Transversal Filter with 100-MHz Bandwidth and Enhanced Programmability," 1985 Ultrasonic Symposium, pp. 124–129.
Oates, et al, "SAW/FET Programmable Transversal Filter with 100-MHz Bandwidth and Enhanced Programmability," pp. 47–50.
Green, et al, "Analog Signal Correlator Using Superconductive Integrated Components," IEEE Transactions on Magnetics, vol. Mag-23, Mar., 1987, pp. 895–898.
Green, "Adaptive and Matched Filtering With a SAW/FET Programmable Transversal Filter," pp. 53–58.
Hoskins, et al, "Recent Developments in Acoustic Charge Transport Devices," 1986 Ultrasonics Symposium, 1986, pp. 439–450.
Wang, IEEE Transactions on Sonics and Ultrasonics, Sep. 1985, vol. 2 Su-32, No. 5, pp. 619–620.
Oates, et al, "Holographic-Grating Acoustic Devices," 1984 Ultrasonics Symposium, pp. 97–102.
Oates, et al, "Wide-Band SAW/FET Programmable Transversal Filter," 1984 Ultrasonics Symposium, pp. 312–317.
Guediri, et al, "Performance of Acoustic Charge Transport Programmable Tapped Delay Line," 1987 Ultrasonics Symposium, pp. 11–14.
Bulletin of the Electrotechnical Laboratory, (Abstract), vol. 48, No. 4, Apr., 1984.

Primary Examiner—Paul M. Dzierzynski
Assistant Examiner—Benny Lee
Attorney, Agent, or Firm—Fish & Richardson

[57] ABSTRACT

A tapped delay line uses a varistor network for tap weighting. The varistors may be used in a resistive summing network or as amplifier gain control elements. In addition, the varistors can be programmed by a voltage programming circuit comprising a switch array, an input voltage programming bus, and sets of master and slave digital programming signals.

17 Claims, 7 Drawing Sheets

MULTI-TAP PROGRAMMING CIRCUIT FOR TRANSVERSAL FILTERS

The Government has rights in this invention pursuant to U.S. Air Force Contract No. F19628-85-C-0002.

This is a continuation of application Ser. No. 07/324,307, filed Mar. 16, 1989, now abandoned.

BACKGROUND OF THE INVENTION

This invention relates to electrical signal filters and particularly to programmable tapped delay line filters.

The wide range of electrical signals used in the fields of communication, navigation and signal identification demands highly flexible signal processing devices. Recently, particular emphasis has been placed upon the implementation of programmable filtering functions. Programmable filters greatly simplify the implementation of analog interfaces in complex signal processing systems. Many approaches have been taken to create near-ideal programmable filters. In general, each approach seeks to optimize the efficiency, cost, size, and performance of the filter.

A tapped delay line filter produces a frequency response by summing weighted, delayed versions of its input. Because the filter response is completely controlled by the tap weights, tapped delay line filters are highly programmable. Recent advances in process technology allow the integration of delay lines onto semiconducting substrates. Thus the full integration of programmable tapped delay line filters is feasible. This high level of integration allows tapped delay line filters to far surpass previous cost and size restrictions.

Many different methods for programming tapped delay line filters have been explored. In each method, an electrical control quantity is used to influence the electrical parameters of the delay line. The electrical parameters of the delay line then directly determine the weighting of the delay line taps. In some programmable delay line filters, the electrical reference quantities are continuous external inputs to the filter circuit. In other cases, the electrical control quantities are stored within the tap-weight control circuitry by an electrical storage apparatus.

One known programmable tapped delay line filter is shown in FIG. 1A. In FIG. 1A, the tap weights are determined by electrical parameters of the delay line. Specifically, the weights of the taps are determined by the capacitance between the tapping conductors 1 and substrate 2. This capacitance, indicated in the figure by $C_{tap}$ 3, is connected to an output bus 38 via an output capacitance $C_{out}$ 4 in such a way that the two capacitors form a capacitive current divider. The ratio of the current flowing in $C_{tap}$ 3 to the current flowing in $C_{out}$ 4 is directly determined by the respective capacitance ratio. The current ratio determines the effective tap weight. Thus the tap weight is indirectly controlled by the capacitance ratio. In the embodiment of FIG. 1, the capacitance $C_{out}$ 4 has a fixed value, but the value of the capacitance $C_{tap}$ 3 is a strong non-linear function of the DC bias voltage of the tap. This DC bias voltage is called $V_{tap}$. Therefore, in this embodiment, the effective tap weight can be controlled by adjusting the DC bias voltage $V_{tap}$. The DC bias voltage is controlled by the tap weight programming circuit illustrated on the right side of FIG. 1A. The outputs $Q_i$ on lines 5 of a shift register 6 connect to several FET switches 7. When the shift register 6 sets an output on a line 5 to a positive logic state, the corresponding FET switch 7 is closed, and the tap weight programming bus 8 is connected to the corresponding delay line tap 1. In this way, a voltage can be placed onto the tap capacitance $C_{tap}$. The circuit of FIG. 1A has the disadvantage that the tap capacitance value $C_{tap}$ is very sensitive to defects in the physical geometry of the taps 1 and substrate 2. Thus the tap weights cannot be programmed accurately. In addition, because of the circuit design, the shift register 6 must have as many outputs as the number of taps in the delay line. This restriction can severely limit the density of the taps on the delay line.

FIG. 1B shows an alternative tap programming mechanism. Each shift register output on a line 5 is used to program two taps 1. When a shift register output 5 is set to a positive logic state, the corresponding master FET switch 9 is closed. Two additional signals $\phi_{odd}$, $\phi_{even}$ 10 then close all switches 11 or all switches 11'. In this way, each of the taps 1 can be separately connected to the programming voltage on the programming bus 8. Through the use of the additional signals on lines 10, the circuit can use a shift register 6 which is half as long as the number of taps.

FIG. 2 shows a tap weighting apparatus based upon a dual gate field effect transistor (DGFET) 12 which cooperates with resistor R and supply voltage $V_{DD}$ to form a transistor amplifier. The gain of the transistor amplifier is controlled by the voltage $V_{gain}$. The output of each DGFET amplifier is summed with the outputs of other amplifiers in a summation mechanism 13. This system is less sensitive to defects in the geometry of the substrate and taps because the weighting mechanism does not depend upon tap capacitance. However, because of its unusual structure, the dual gate FET 12 has not been manufactured on the same semiconducting substrate as the tapped delay line, So this implementation has not taken advantage of a single substrate architecture.

Another solution using dual gate FET's 12, a resistor R, and a supply voltage $V_{DD}$ to form an amplifier is shown in FIG. 3A and 3B. In FIG. 3B each delay line tap 1 is connected to an array of dual gate FET's 12. Each FET 12 in the array has a different geometry, and thus has a different output gain. The second gate of each FET 12 is controlled by a digital gain control voltage $G_1$-$G_4$. As illustrated in FIG. 3A, a digital latch 14 connected to a digital tap weight programming bus 39 is used to store the state of the gain control voltage. The states of the gain control voltages are selected to produce the desired overall tap gain. This programming mechanism allows digital storage of tap weights, however, as in the circuit of FIG. 2, the use of DGFET's 12 has necessitated the use of two separate substrates. In addition, the digital latches 14 consume large amounts of area.

FIG. 4 shows an alternative tap weight programming mechanism, In FIG. 4, the tap weight is a function of the non-linear capacitance of the tap $C_{tap}$ 3, the output capacitance $C_{out}$ 4, and the incremental resistance of two diodes D1 and D2 designated at 19. The tap bias voltage $V_{tap}$ (and therefore the tap capacitance $C_{tap}$) and the diode incremental resistances are controlled by the currents in two current sources $S_1$, $S_2$, designated at 20 (having a series resistance R). This tap weighting mechanism is effective, but it relies on tap capacitance, and thus is sensitive to defects in the substrate and tap geometries. In addition, a set of programming current sources 20 must be implemented for each tap, resulting in a large amount of control circuitry.

FIG. 5 shows another solution to tap weighting. The tap weight is controlled by a pair of field effect transistors 15 which cooperate with a supply voltage $V_{DD}$ to form an amplifier. The tap voltage drives the gate of one FET 15 and a gain voltage 21 drives the gate of the other FET 15. In this system, the same gain voltage 21 is supplied to each tap amplifier. Therefore, each tap has the same gain. After the tap amplifier, the amplifier tap voltage is connected to a positive or negative summing bus 17, 18 by two switching FET's 16 which are controlled by digital signal $TO_+$ and $TO_-$. In this way, the tap may have a $+1$ or $-1$ relative gain. The programming circuitry can be quite simple, because digital voltages are used to select the relative gain. However, the lack of continuous gain adjustment limits the circuit's programmability.

SUMMARY OF THE INVENTION

The invention generally features a programmable tap-weighting apparatus for use with a tapped delay line filter. This tap-weighting apparatus comprises several elements. One element is a tapped delay line including a plurality of tap outputs. Another element is a mechanism for storing a plurality of continuously variable tap weighting voltages. An additional element is an electrical summing mechanism including a plurality of summing inputs. Also, the invention features a plurality of variable resistance elements, each element comprising two signal terminals and a control terminal, where the electrical resistance between the signal terminals is responsive to the voltage of the control terminal. The above elements are arranged to achieve the goals of the invention. Each variable resistance element is arranged to provide a resistive electrical path from one of the tap outputs to one of the electrical summing inputs. Also, each resistance control terminal is connected to one of the stored tap weighting voltages.

The invention generally features another embodiment of a programmable tap weighting apparatus for use with a tapped delay line filter. This embodiment of the tap-weighting apparatus also comprises several elements. One element is a tapped delay line including a plurality of tap outputs. Another element is a mechanism for storing a plurality of continuously variable tap weighting voltages. An additional element is an electrical summing mechanism including a plurality of summing inputs. Additional elements include a plurality of buffer amplifiers, each having an input and an output, where the amplifier gain is responsive to the ratio of two resistances. Also, the invention includes a plurality of variable resistance elements, each element comprising two signal terminals and a control terminal, where the electrical resistance between the signal terminals is responsive to the voltage of the control terminal. The above elements are arranged to achieve the goals of the invention. Each buffer amplifier input is connected to one of the tap outputs. Each buffer amplifier output is connected to one of the electrical summing inputs. Each buffer amplifier gain is responsive to the ratio of a fixed resistance and the resistance of one of the variable resistance elements. Also, the control input of each variable resistance element is connected to one of the stored tap weighting voltages.

Additionally, the invention features either embodiment of a programmable tap-weighting apparatus in which the variable resistance elements are field effect transistors.

Additionally, the invention features either embodiment of a programmable tap-weighting apparatus further embodied as an integrated structure on a monolithic semiconducting substrate.

Additionally, the invention features either embodiment of a programmable tap-weighting apparatus in which the inputs to the summing mechanisms are summed negatively and positively. In this case, the delay lines, tap weighting voltages, and variable resistance elements are configured to create complementary positive and negative circuits.

The invention also features either embodiment of a programmable tap-weighting apparatus where the tapped delay line is a surface acoustic wave delay line, an acoustic charge transport delay line, or a charge coupled device delay line.

The invention also generally features an apparatus for storing a plurality of continuously variable voltages. This apparatus comprises several elements. One element is a plurality of capacitors having a first terminal connected to a datum voltage node, and a second terminal. Other elements include at least one signal switch and at least one bus switch, where each switch comprises two signal terminals and a control terminal, where the electrical resistance between the signal terminals is responsive to the voltage of the control terminal. Another element is a set of time-varying master digital input signals, where the time variance of the master signals is such that only one signal of the set has a positive logical state at any time. Another element is a set of time-varying slave digital input signals, where the time variance of the slave signals is such that only one signal of the set has a positive logical state at any time. Additionally, the time variance of the slave signals is such that at least two of the slave signals transition to a positive logical state during the time that one master signal is in a positive logical state. Another element is a time-varying analog input voltage, where its time variance is synchronized with the time variance of the master and slave digital input signals. Additional elements include a plurality of input busses, each bus connected to the second terminal of one of the capacitors. The above elements are arranged to achieve the goals of the invention. Each of the busses is electrically responsive to the analog input voltage via the controlled resistance of a bus switch. Also, the control terminal of each bus switch is connected to one of the slave digital input signals. Further, each of the busses is connected to a signal terminal of at least one signal switch. The other signal terminal of the switch is connected to the second terminal of a capacitor. Also, the control terminal of each switch is connected one to of the master digital control signals.

The invention also features the above storage apparatus, where the members of the set of slave input signals are the two complementary outputs of a digital flip flop or a digital shift register.

The invention also features the above storage apparatus, where the members of the set of master input signals are the outputs of a digital shift register.

The invention also features the above storage apparatus embodied as an integrated structure on a monolithic semiconducting substrate.

Other features and advantages of the invention will become apparent from the following detailed description when read in connection with the accompanying drawings in which:

DETAILED DESCRIPTION

Figure 1A:
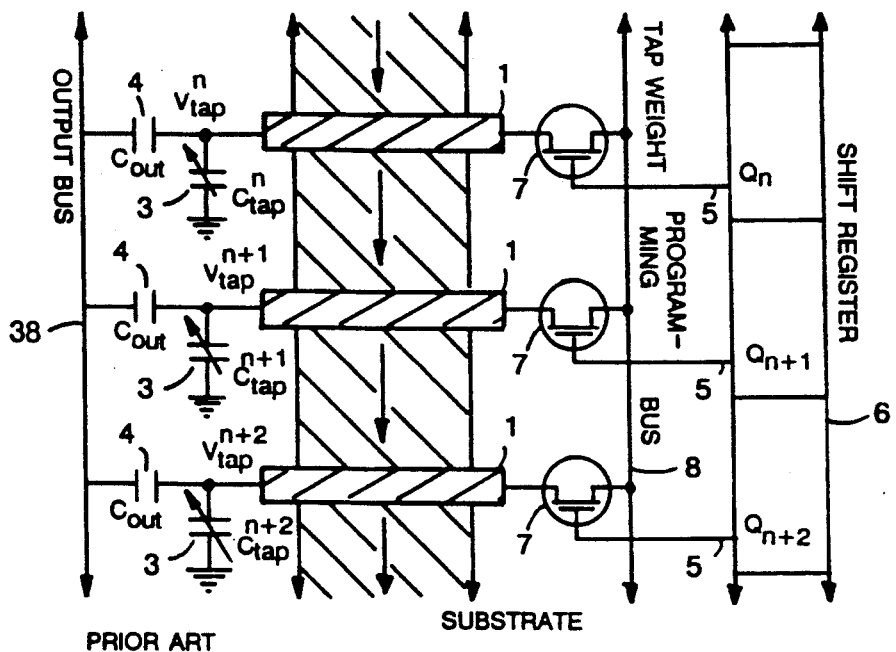
FIG. 1A and 1B are circuit diagrams for prior art capacitive tap weighting circuits.
Figure 1B:
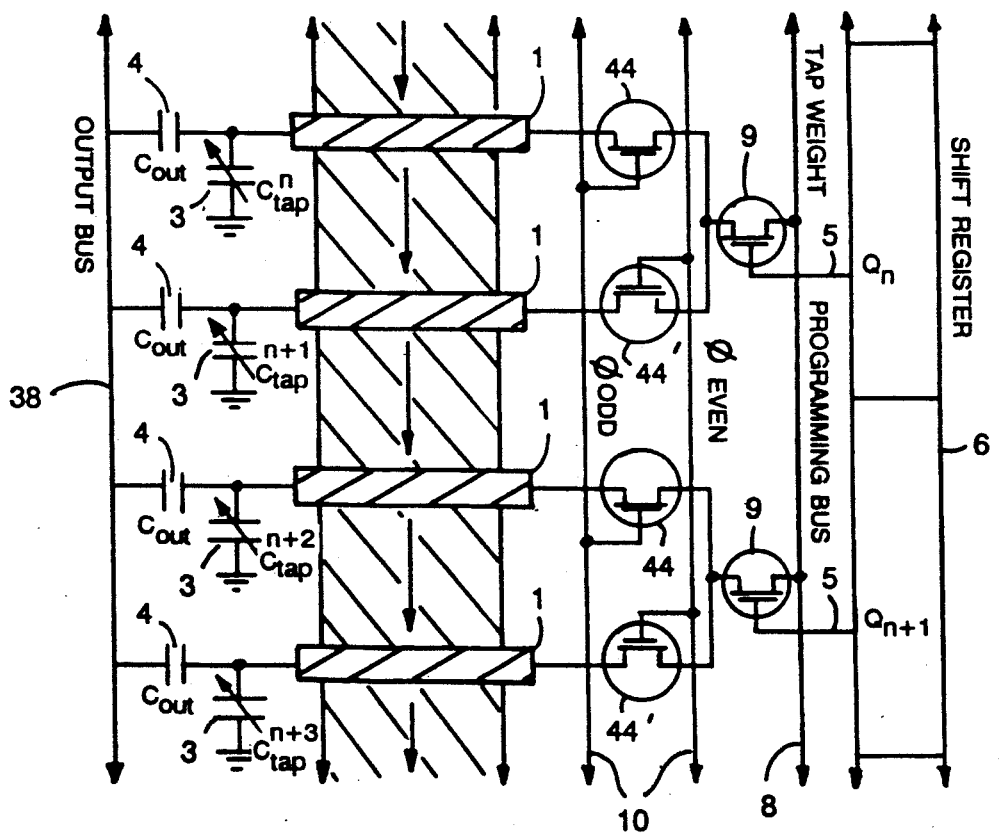
Figure 2:
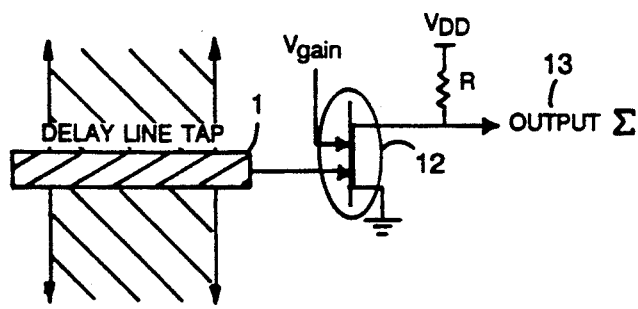
FIG. 2 is a circuit diagram of a prior art dual gate FET amplifier tap weighting circuit.
Figure 3A:
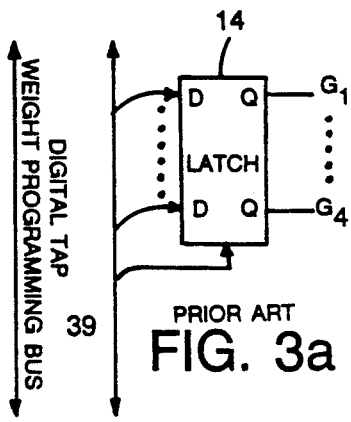
FIGS. 3A and 3B are diagrams of a prior art dual gate FET amplifier tap weighting circuit, and control logic.
Figure 3B:
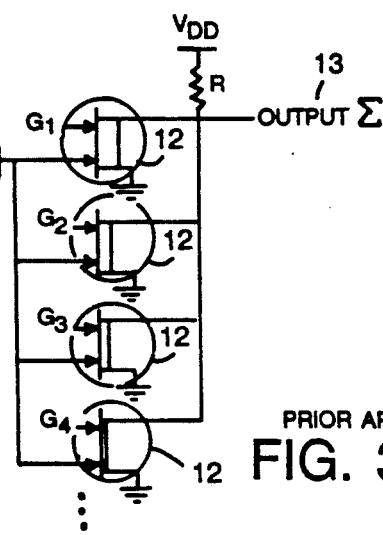
Figure 4:
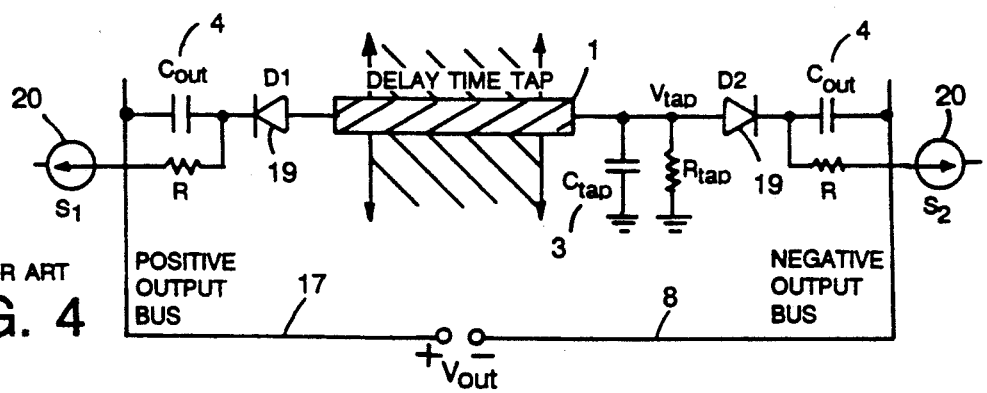
FIG. 4 is a circuit diagram of a prior art capacitance and diode tap weighting circuit.
Figure 5:
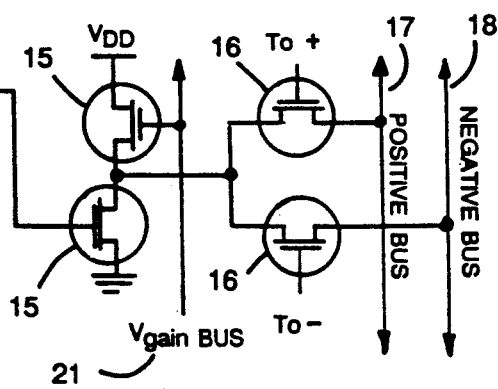
FIG. 5 is a circuit diagram of a prior art FET amplifier tap weighting circuit.
Figure 6A:
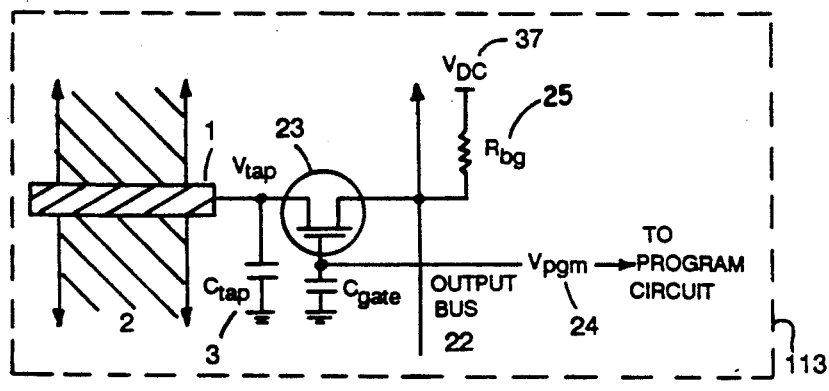
FIG. 6A is a circuit diagram of a first embodiment of a tap weighting circuit according to the invention.

One embodiment of the invention is a wide band programmable transversal filter that uses an acoustic delay line as a wide band delay element and a Si metal oxide semiconductor integrated circuit for programmable tap weighting. Substantial design improvements over the prior art have simplified the integrated circuit processing, yielded better uniformity, lower insertion loss, and a higher programmable on/off ratio. Prior art acoustic delay lines have been described in detail above in conjunction with FIGS. 1A, 1B, 2, 3A, 3B, 4, and 5. FIG. 6a shows a delay line tap coupled to an integrated circuit according to the invention. The integrated circuit residing in substrate 113 contains programmable analog circuits which process the signal propagating along the delay line 2. The tap 1 is a metal finger on a Si substrate 113 which is capacitively coupled to the electric field of the acoustic delay line across a narrow air gap. In one embodiment, the air gap is maintained by $SiO_2$ rails deposited on the silicon substrate 113. Prior art delay line weighting apparatus used the parasitic MOS varactors $C_{tap}$ (designated 3) (voltage control capacitors) associated with each tap finger as a tap weighting element, as seen in FIGS. 1A and 1B. In the present design, as seen in FIG. 6A, the taps are coupled to a summing bus 22 by programmable resistive elements 23. The resistive elements can, in one embodiment, comprise MOSFETs used as varistors (electrically variable resistors). The varistors 23 are programmed by bias voltages $V_{pgm}$ 24 introduced through a programming network and stored by the varistor gate capacitance $C_{gate}$. The bias voltage of the tap 1 is maintained through a large pullup resistor $R_{big}$ 25 which connects the tap summing bus 22 to a DC voltage $V_{DC}$ designated 37. In this way, the DC voltage of the taps 1 can be fixed so that the non-linear tap varactor $C_{tap}$ (designated 3) does not change value. The varistor resistance 23 can then be used to control the tap weight.

Figure 6B:
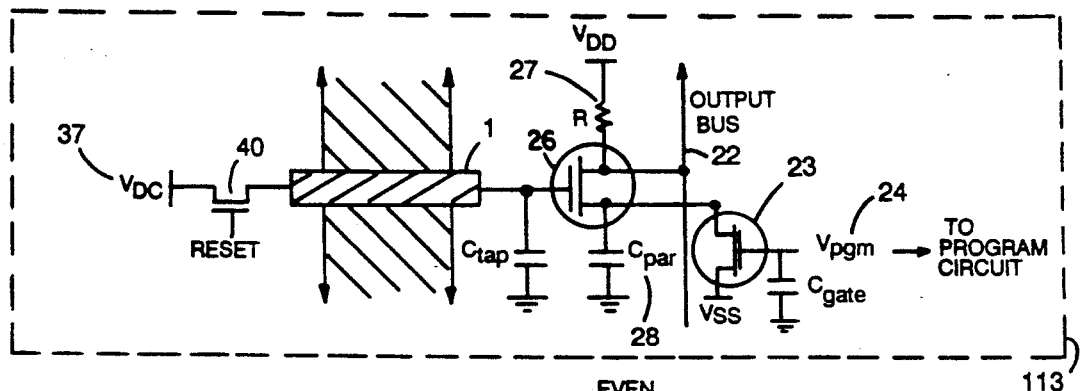
FIG. 6B is a circuit diagram of a second embodiment of a tap weighting circuit according to the invention.

In an alternative embodiment shown in FIG. 6B, the tap 1 is connected to the gate of a MOSFET 26 which is configured as a variable gain amplifier using supply voltages $V_{DD}$ and $V_{SS}$. The gain of the FET 26 is propotional to the ratio of the resistance R 27 and the resistance of the MOSFET 23. In this application, it is the MOSFET 23 which is used as the programming varistor. The varistor, resistance is programed by a program voltage $V_{pgm}$ 24. The DC bias voltage of the tap 1 is controlled by a reset switch 40 and a DC source 37. This fixes the value of the non-linear tap varactor, $C_{tan}$ (designated 3) and allows programming to be accomplished with the varistor.

The embodiment of the invention shown in FIG. 6A is preferred because the parasitic capacitance $C_{par}$ 28 shown in FIG. 6B makes the tap gain uncontrollable at high frequencies. No such parasitic effect occurs in the embodiment in FIG. 6A.

The use of varistors rather than varactors to program the tap weights has other advantages as well. The varistors do not require the substrate p-well used by varactor circuits, resulting in a simplier process. Additionally, the varistors have much smaller active area than the varactors and thus are less sensitive to random defects. Furthermore, the electrical characteristics of the varistors are less affected by traps and surface states in the substrate. Finally, the varistor conductance varies linearly over a wide range of control voltages, while the varactor capacitance varies non-linearly over a narrow voltage range. This simplification and reduction in sensitivity has increased the fabrication yield of good tapped delay line chips.

Figure 7A:
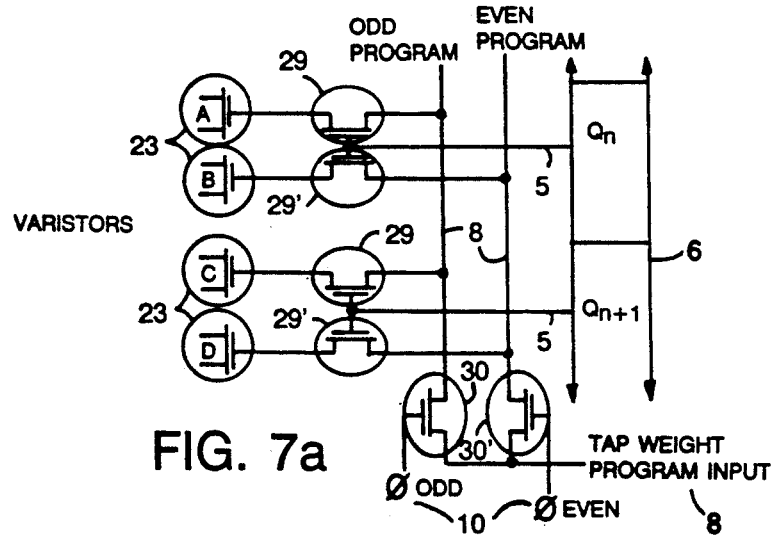
FIGS. 7A and 7B are circuit and timing diagrams of a first embodiment of a voltage storage apparatus according to the invention.
Figure 7B:
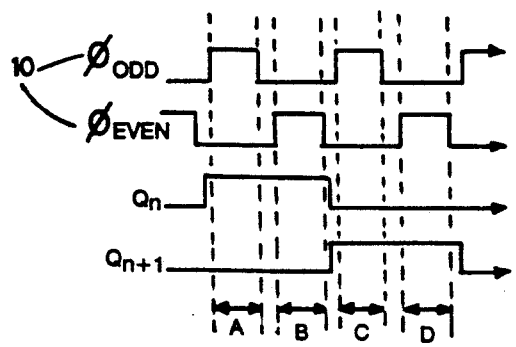

FIG. 7A shows a varistor control voltage programming network for use with the circuits of FIGS. 6A and 6B. The varistor 23 weights are programmed by bias voltages. These bias voltages are introduced through a programming network that is controlled by an on-chip digital shift register 6. The shift register 6 has one output $Q_i$ for every two programming varistors, 23 similiar to the circuit of FIG. 1B. However, the inventive circuit uses one fewer transistor per tap than the prior art circuit, yet still allows sequential loading of analog tap weight voltages. This is accomplished by replacing the three transistor network, 9, 11, 17' of FIG. 1B with a two transistor network 29, 29'. The two transistor network is controlled by a shift register output $Q_i$ via a line and a slave transistor network 30, 30' via a line 8. Network 30, 30' is controlled by the signals 10. The timing diagram in FIG. 7B shows the relative timing of the signals 10 and the shift register outputs $Q_i$.

The time variance of signals $Q_1$, $Q_2$, $Q_3$, etc. (termed the "master" control signals) which control the transistor networks 29, 29' (termed the "master" networks) is such that only one of the signals $Q_1$, $Q_2$, $Q_3$, etc. has a positive logical state at any time, and thus, one and only one pair of master transistors 29, 29' is turned on at any time. Similarly, the time variance of the signals $\phi_{odd}$, $\phi_{even}$ 10 (termed the "slave" control signals) which control the slave transistor network 30, 30', is such that only one of the slave signals has a positive logical state at any time, and thus only one of the slave transistors 30, 30' is turned on at any time. Furthermore, both slave signals $\phi_{odd}$ and $\phi_{even}$ transition to and from a positive logical state during the time that one master signal $Q_1$, $Q_2$, $Q_3$, etc. is in a positive logical state, so that each slave transistor 30, 30' turns on an doff once while a given pair of master transistors 29, 29' is turned on. As a result, the gates of the tap-weighting varistors 23 are sequentially connected to the tap weight programming input signal 8 via one of the slave transistors 30 or 30', one of the programming busses 8, and one of the master transistors 29 or 29'.

Figure 8A:
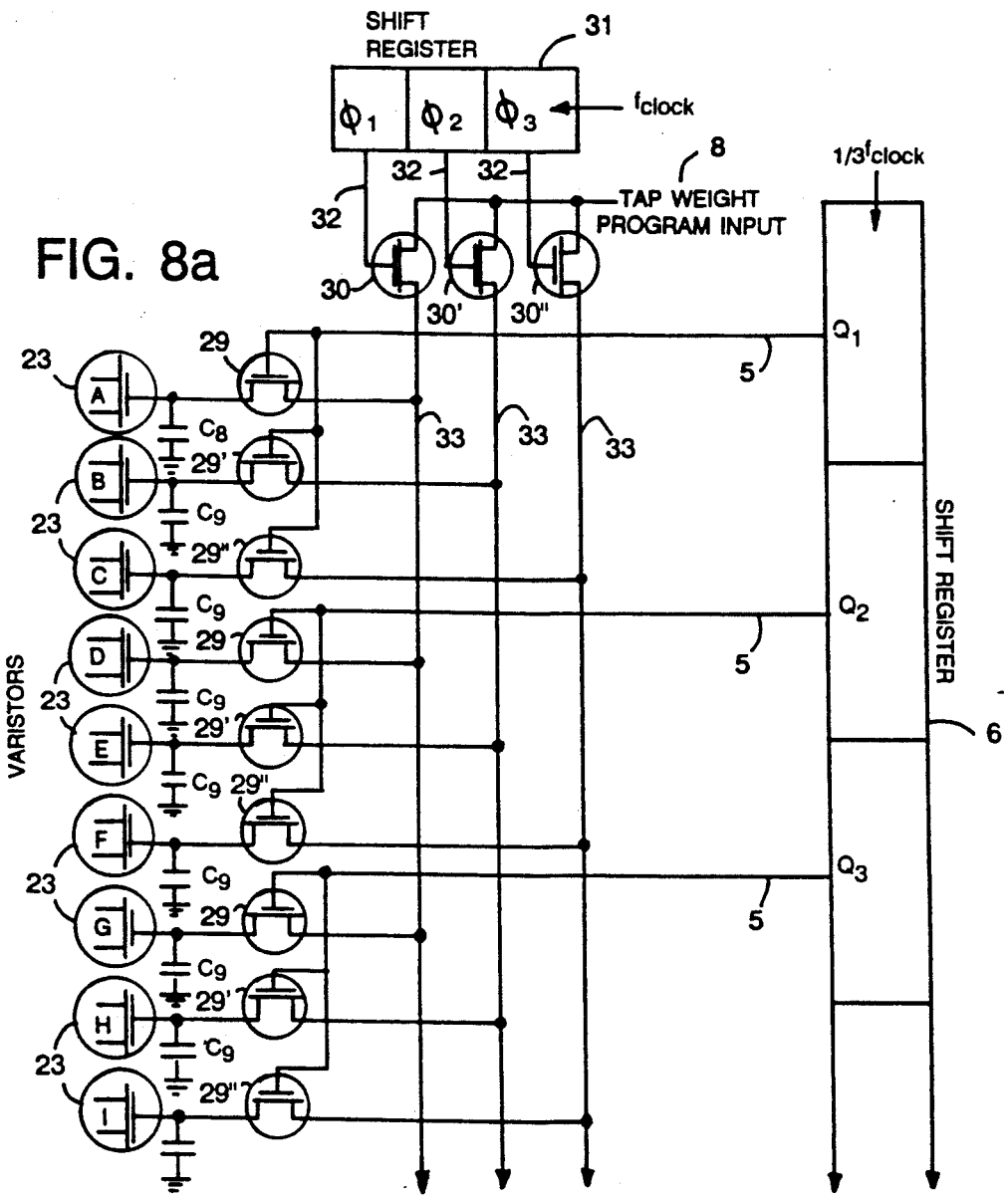
FIGS. 8A and 8B are circuit and timing diagrams of a second embodiment of a voltage storage apparatus according to the invention.

By expand the inventive methods used to create the circuit in FIG. 7A, the generalized circuit of FIG. 8A can be created. In FIG. 8A, the shift register 6 creates a set of master control signals $Q_i$ on lines 5. An additional shift register 31 creates slave control signals $\phi_1$ on lines 32. The slave control signals on lines 32 are used to control the tap weight programming buses 33 and the master control signals on lines 5 are used to select the varistor 23 which is to be programmed. This architecture minimizes the total shift register length, and thus has significant size and density advantages over the prior art circuits.

Figure 8B:
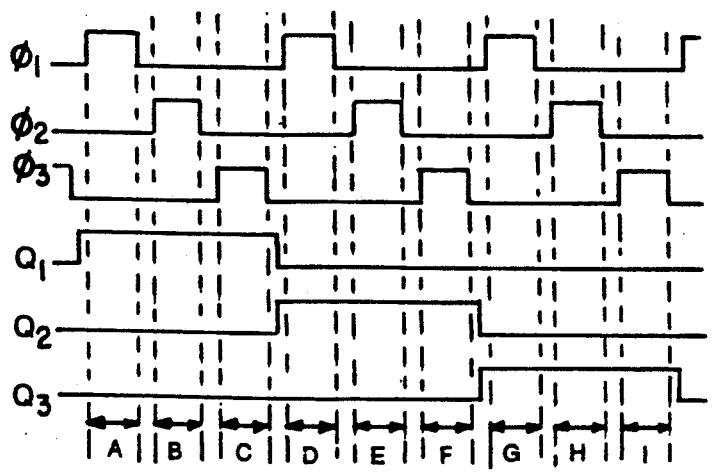

As seen in FIG. 8B, the time variance of the signals which control the circuit of FIG. 8A is similar to the signals which control the circuit of FIG. 7A. In particular, only one of the master control signals (which control the master transistor networks 29, 29', 29'') has a positive logical state at any time; similarly, only one of the slave control signals $\phi_1$, $\phi_2$, $\phi_3$ (which control the slave transistor network 30, 30', 30'') has a positive logical state at any time. Furthermore, all three slave signals $\phi_1$, $\phi_2$ and $\phi_3$ transition to and from a positive logical state during the time that one master signal $Q_i$ is in a positive logical state, so that each slave transistor turns on and off once while a given triplet of master transistors is turned on. As a result, the gates of the tap-weighting varistors 23 are sequentially connected to the tap weight programming input signal 8 via one of the slave transistors 30, 30' or 30'', one of the programming busses 33, and one of the master transistors 29, 29', or 29''.

Figure 9:
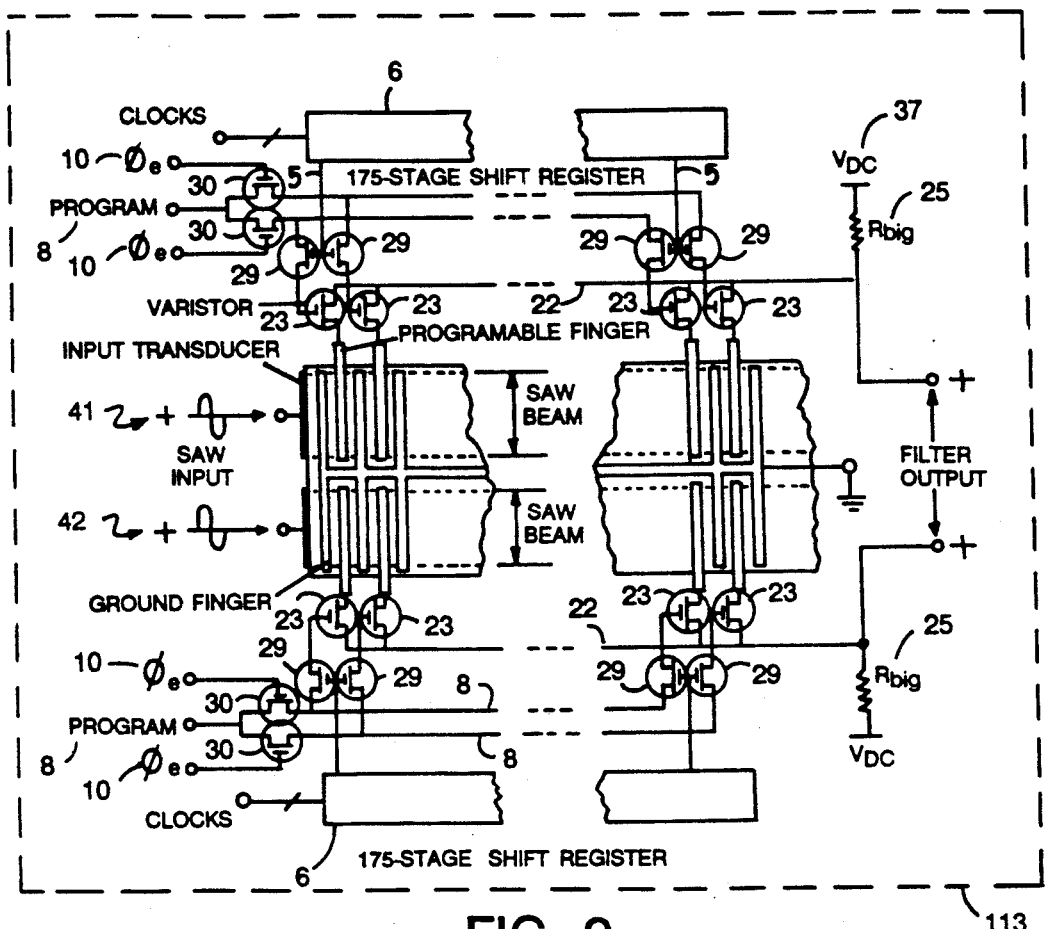
FIG. 9 is a circuit diagram of a voltage storage and tap weighting apparatus according to the invention.

FIG. 9 shows a complete embodiment of the invention including the inventive varistor circuit of FIG. 6A and the inventive tap weight programming circuit of FIG. 7A. In this particular embodiment, the tapped delay line is a surface accoustic wave delay line. In this embodiment, circuit has two halves a "positive" half 41 and a "negative" half 42. This structure increases the programmable on/off ratio of the tapped delay line and provides bipolar programming weights.

The positive half 41 of the circuit and the negative half 42 of the circuit are exact complements of each other. The filter output is the differential voltage 34 between the output terminals of the positive and negative halves 41, 42 of the circuit.

Figure 10A:
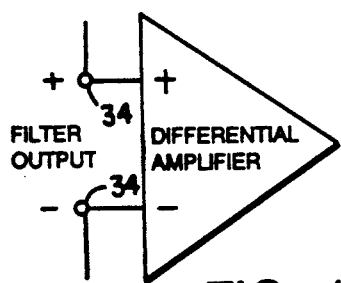
FIGS. 10A and 10B are embodiments of an output amplifier according to the invention.
Figure 10B:
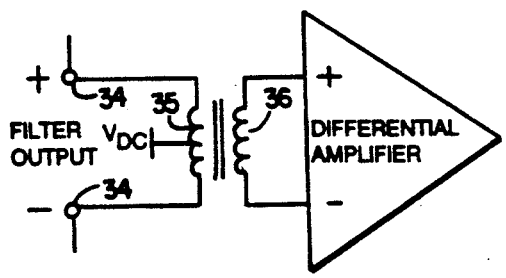

FIG. 10A and 10B show output differential amplifiers which could be connected to the filter output terminals 34 in FIG. 9. In FIG. 10A the output terminals 34 are connected directly to a differential amplifier. In FIG. 10B the output terminals are connected to a transformer primary 35. The transformer secondary 36 connects to a differential amplifier. In this embodiment, the transformer can be used to produce signal gain. In addition, the DC bias voltage of the delay line taps can be set by the voltage 37 connected to the center tap of the primary transformer.

Figure 11A:
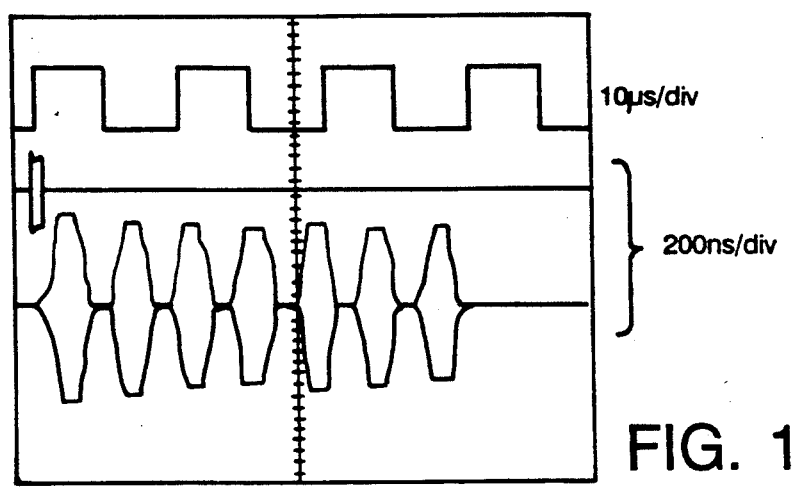
FIGS. 11A and 11B show oscilloscope photographs of the impulse response of the invention when the tap weights are programmed with a square wave.
Figure 11B:
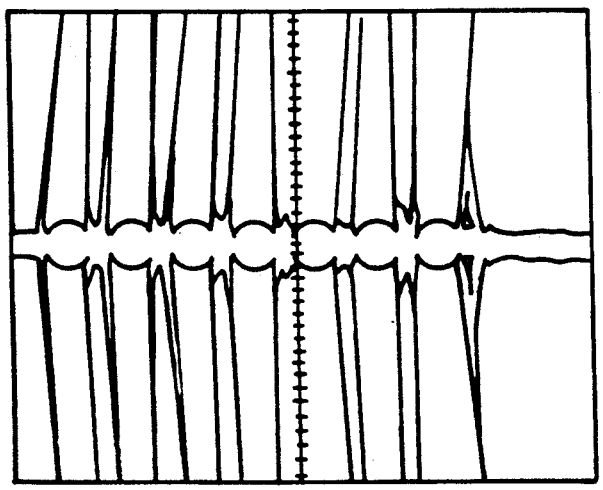

FIG. 11A shows the impulse response of the filter of FIG. 9 when programmed with a square wave. In this case, groups of 10 adjacent taps are turned fully on and the next 10 adjacent taps on turned fully off. The top trace shows the programming waveform, the middle trace is the input RF impulse, and the bottom trace shows the RF output. (Note the different time scales for the RF input and output and for the programming input.) As can be seen from FIG. 11B, which shows the RF output with 30 dB additional gain, the on/off ratio is greater than 30 dB, and the tap to tap uniformity of plus or minus 1 dB is excellent.

Figure 12:
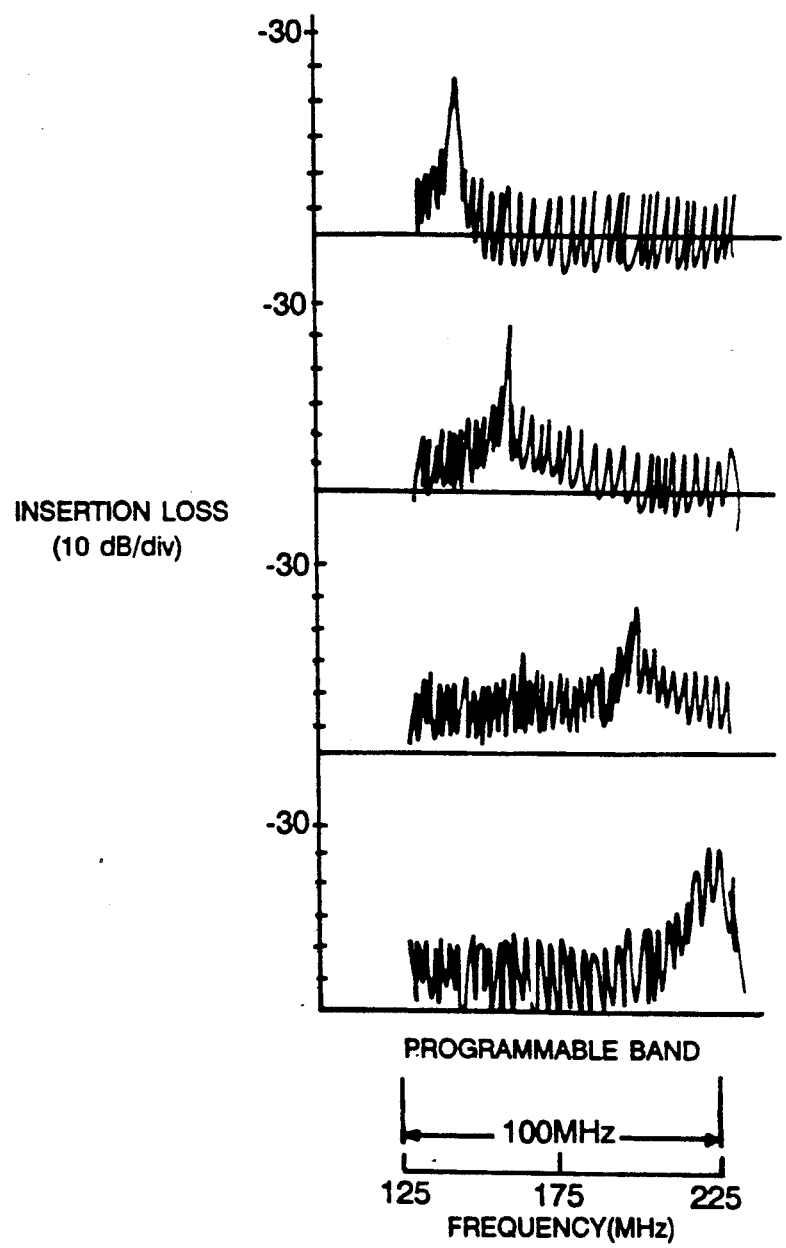
FIG. 12 shows oscilloscope photographs of the frequency response of the invention when programmed as a band-pass filter.

FIG. 12 shows the frequency response of the filter of FIG. 9 when programmed as a narrow band filter. The four photographs show the output passbands between 130 and 212 MHz produced by four programming inputs, generating four different center passbands. The device clearly shows 100 MHz of programmable bandwidth. The out of band rejection is seen to be about 40 dB for most frequencies. At some frequencies, higher spatial harmonics are generated by the slightly nonlinear relationship between programming voltage and tap weight, and are aliased about the 232 MHz effective sampling frequency and appear inband. The insertion loss is less than 40 dB, and the dynamic range over thermal noise is greater than 75 dB with a 27 dBm input signal.

These results show that the inventive varistor tap weighting circuitry provides improved on/off ratio, uniformity, linearity, and insertion loss over prior art capacitive weighting circuits. This improvement in performance is achieved with a fabrication procedure for the Si FET wafers that is simpler and has a higher yield than prior art procedures.

What is claimed is:

1. A first programmable tap-weighting apparatus which is an integrated circuit in a monolithic substrate, said substrate being at a datum voltage, for weighting and summing the outputs of a first tapped delay line, said first delay line accepting a time-varying voltage at a delay line input terminal and producing time-delayed replicas of said input terminal voltage at a plurality of delay line output terminals, comprising:
   a plurality of single-gate field effect transistors, each field effect transistor comprising first and second terminals and only one gate terminal, wherein:
   the first terminal of each respective field effect transistor is connected to a respective delay line output,
   the second terminal of each respective field effect transistor is connected to a respective electrical summing input terminal of a first electrical summing mechanism, said summing mechanism generating an output on a summing output terminal proportional to the sum of the voltages on all of said summing input terminals measured relative to said datum voltage, and
   the gate terminal of each respective field effect transistor is connected to a respective programming output terminal of a programming means, said programming means generating a plurality of variable weighting voltages on said programming output terminals relative to said datum voltage.

2. The apparatus of claim 1 further comprising
   a second programmable tap-weighting apparatus for weighting and summing the outputs of a second tapped delay line, said second delay line accepting a time-varying voltage at a delay line input terminal and producing time-delayed replicas of said input terminal voltage at a plurality of delay line output terminals, comprising:

a second plurality of single-gate field effect transistors, each field effect transistor comprising first and second terminals and only gate terminal, wherein:

the first terminal of each respective field effect transistor of said second plurality is connected to a respective delay line output of said second tapped delay line, the second terminal of each respective field effect transistor of said second plurality is connected to a respective electrical summing input terminal of a second electrical summing mechanism, said second summing mechanism generating an output on a second summing output terminal proportional to the sum of the voltages on all of said second summing mechanism's summing input terminals measured relative to said datum voltage, and the gate terminal of each respective field effect transistor of said second plurality is connected to a respective programming output terminal of a second programming means, said second programming means generating a plurality of variable weighting voltages on said second programming means' programming output terminals relative to said datum voltage; and a differential amplifier having two input terminals for amplifying the difference between the output of said first summing mechanism and the output of said second summing mechanism, whereby the outputs of said first and second tapped delay lines are weighted in a bipolar fashion by said respective programming means.

3. The apparatus of claim 2 further comprising a transformer coupled between the outputs of said first and second summing mechanisms and said differential amplifier, a primary winding of said transformer connected between the summing output terminal of said first summing mechanism and the second summing output terminal of said second summing mechanism, and a secondary winding of said transformer connected between the input terminals of said differential amplifier.

4. The programmable tap-weighting apparatus of claim 1, wherein said programming means for generating a plurality of variable weighting voltages on said plurality of output terminals comprises:

a plurality of signal switches comprising field effect transistors, each field effect transistor including first and second terminals and a gate terminal;

a plurality of bus switches comprising field effect transistors, each field effect transistor including first and second terminals and a gate terminal;

master signal means for generating a plurality of master time-varying logical signals on a corresponding plurality of master signal terminals, said master logical signals having a time variance such that only one of said plurality of master logical signals has a positive logical state at any time;

slave signal means for generating a plurality of slave time-varying logical signals on a corresponding plurality of slave signal terminals, said slave logical signals having a time variance such that only one of said plurality of slave logical signals has a positive logical state at any time and at least two of said plurality of slave logical signals transition to a positive logical state during the time that said one master logical signal maintains a positive logical state;

means for generating a time-varying analog programming signal on an analog signal terminal; and a plurality of signal busses, wherein:

each respective signal bus is connected to the first terminal of one respective field effect transistor of one said bus switch, the second terminal of the respective field effect transistor of said one bus switch is connected to said analog signal terminal, and the gate terminal of the respective field effect transistor of said one bus switch is connected to a respective slave signal terminal; and each respective signal bus is further connected to the first terminal of one or more respective field effect transistors of one or more said signal switches, the second terminal of each respective field effect transistor of said one or more signal switches is connected to a respective programming output terminal, and the gate terminal of each respective field effect transistor of said one or more signal switches is connected to a respective master signal terminal.

5. The apparatus of claim 4, wherein said master signal means comprises a digital shift register and said shift register provides outputs on said master signal terminals.

6. The apparatus of claim 5, wherein said slave signal means comprises a digital flip-flop and said flip-flop provides outputs on said slave signal terminals.

7. The apparatus of claim 5, wherein said slave signal means comprises a digital shift register and said shift register provides outputs on said slave signal terminals.

8. A first programmable tap-weighting apparatus for weighting and summing the outputs of a first tapped delay line, said first delay line accepting a time-varying voltage at a delay line input terminal and producing time-delayed replicas of said input terminal voltage at a plurality of delay line output terminals, comprising:

a plurality of buffer amplifiers, each including an input connected to a respective delay line output terminal for receiving a continuously variable input voltage measured relative to a datum voltage, means for generating an output voltage on an output terminal measured relative to said datum voltage and linearly related to said input voltage, first and second control terminals, and means for driving a current between said first and second control terminals, said linear relation between said input voltage and said output voltage responsive to the voltage generated between said first and second control terminals when said current is travelling between said first and second control terminals; and a plurality of solid-state variable resistance elements, each element comprising first and second signal terminals and a third terminal, said first and second signal terminals respectively connected to said first and second control terminals; wherein:

the output terminal of each respective buffer amplifier is connected to a respective electrical summing input terminal of a first electrical summing mechanism, said summing mechanism generating an output on a summing output terminal proportional to the sum of the voltages on all of said summing input terminals measured relative to said datum voltage, and the third terminal of each respective variable resistance element is connected to a respective programming output terminal of a programming means, said programming means generating a plurality of variable weighting voltages on said programming output terminals relative to said datum voltage, the voltage generated between the first and second signal terminals of each said variable resistance element being responsive to the amount of current flowing between said first and second signal terminals and the voltage applied to said third terminal relative to said datum voltage.

9. The apparatus of claim 8 wherein
said apparatus is an integrated circuit in a monolithic substrate at said datum voltage, and
said solid-state variable resistance element is a single-gate field effect transistor comprising first and second signal terminals and only one gate terminal, and said third terminal is said gate terminal.

10. The apparatus of claim 8, further comprising
a second programmable tap-weighting apparatus for weighting and summing the outputs of a second tapped delay line, said second delay line accepting a time-varying voltage at a delay line input terminal and producing time-delayed replicas of said input terminal voltage at a plurality of delay line output terminals, comprising:
a second plurality of buffer amplifiers, each including
an input connected to a respective delay line output terminal for receiving a continuously variable input voltage measured relative to said datum voltage,
means for generating an output voltage on an output terminal measured relative to said datum voltage and linearly related to said input voltage,
first and second control terminals, and
means for driving a current between first and second control terminals, said linear relation between said input voltage and said output voltage responsive to the voltage generated between said first and second control terminals when said current is travelling between said control terminals; and
a plurality of solid-state variable resistance elements, each element comprising first and second signal terminals and a third terminal, said first and second signal terminals respectively connected to said first and second control terminals; wherein:
the output terminal of each respective buffer amplifier of said second plurality is connected to a respective electrical summing input terminal of a second electrical summing mechanism, said second summing mechanism generating an output on a second summing output terminal proportional to the sum of the voltages on all of said second summing mechanism's summing input terminals measured relative to said datum voltage, and
the third terminal of each respective variable resistance element of said second plurality of buffer amplifiers is connected to a respective programming output terminal of a second programming means, said second programming means generating a plurality of variable weighting voltages on said second programming means' programming output terminals relative to said datum voltage, the voltage generated between the first and second signal terminals of each said variable resistance element being responsive to the amount of current flowing between said first and second signal terminals and the voltage applied to said third terminal relative to said datum voltage; and a differential amplifier having two input terminals for amplifying the difference between the output of said first summing mechanism and the output of said second summing mechanism,
whereby the outputs of said first and second tapped delay lines may be weighted in a bipolar fashion by said respective programming means.

11. The apparatus of claim 10 further comprising
a transformer coupled between the outputs of said first and second summing mechanisms and said differential amplifier, a primary winding of said transformer connected between the summing output terminal of said first summing mechanism and the second summing output terminal of said second summing mechanism, and a second winding of said transformer connected between the input terminals of said differential amplifier.

12. The programmable tap-weighting apparatus of claim 8, wherein said programming means for generating a plurality of variable weighting voltages on a plurality of output terminals comprises:
a plurality of signal switches comprising field effect transistors, each field effect transistor including first and second terminals and a gate terminal;
a plurality of bus switches comprising field effect transistors, each field effect transistor including first and second terminals and a gate terminal;
master signal means for generating a plurality of master time-varying logical signals on a corresponding plurality of master signal terminals, said master logical signals having a time variance such that only one of said plurality of master logical signals has a positive logical state at any time;
slave signal means for generating a plurality of slave time-varying logical signals on a corresponding plurality of slave signal terminals, said slave logical signals having a time variance such that only one of said plurality of slave logical signals has a positive logical state at any time and at least two of said plurality of slave logical signals transition to a positive logical state during the time that said one master logical signal maintains a positive logical state;
means for generating a time-varying analog programming signal on an analog signal terminal; and
a plurality of signal busses,
wherein:
each respective signal bus is connected to the first terminal of one respective field effect transistor of one said bus switch, the second terminal of the respective field effect transistor of said one bus switch is connected to said analog signal terminal, and the gate terminal of the respective field effect transistor of said one bus switch is connected to a respective slave signal terminal; and
each respective signal bus is further connected to the first terminal of one or more respective field effect transistors of one or more said signal switches, the second terminal of each respective field effect transistor of said one or more signal switches is connected to a respective programming output terminal, and the gate terminal of each respective field effect transistor of said one or more signal switches is connected to a respective master signal terminal.

13. The apparatus of claim 12, wherein said master signal means comprises a digital shift register and said shift register provides outputs on said master signal terminals.

14. The apparatus of claim 13, wherein said slave signal means comprises a digital flip-flop and said flip-flop provides outputs on said slave signal terminals.

15. The apparatus of claim 14, wherein said apparatus is an integrated structure on a monolithic substrate at said datum voltage.

16. The apparatus of claim 13, wherein said slave signal means comprises a digital shift register and said shift register provides outputs on said slave signal terminals.

17. The apparatus of claim 16, wherein said apparatus is an integrated structure on a monolithic substrate.

* * * * *

UNITED STATES PATENT AND TRADEMARK OFFICE
CERTIFICATE OF CORRECTION

PATENT NO. : 5,194,837
DATED : March 16, 1993
INVENTOR(S) : Daniel L. Smythe, Jr.; Jonathan B. Green It is certified that error appears in the above-indentified patent and that said Letters Patent is hereby corrected as shown below:

Column 2, line 18, insert --on lines-- after "$\phi_{even}$".

Column 2, line 36, "So" should be --so--.

Column 3, line 10, "amplifier"(second occurrence)  --amplified--.

Column 6, line 53, insert --$\phi_{odd}$, $\phi_{even}$-- after "signals".

Column 7, line 3, "an doff" should read --and off--.

Column 7, line 10, "expand" should be --expanding--.

Column 7, line 25, insert --$\phi_1$, $\phi_2$, $\phi_3$, etc.-- after "signals".

Signed and Sealed this

Nineteenth Day of April, 1994

Attest:

BRUCE LEHMAN

*Attesting Officer*   *Commissioner of Patents and Trademarks*